United States Patent
Luby

(10) Patent No.: US 9,294,227 B2
(45) Date of Patent: Mar. 22, 2016

(54) LT STAIRCASE FEC CODE

(71) Applicant: QUALCOMM Incorporated, San Diego, CA (US)

(72) Inventor: Michael George Luby, Berkeley, CA (US)

(73) Assignee: QUALCOMM Incorporated, San Diego, CA (US)

( * ) Notice: Subject to any disclaimer, the term of this patent is extended or adjusted under 35 U.S.C. 154(b) by 221 days.

(21) Appl. No.: 14/166,347

(22) Filed: Jan. 28, 2014

(65) Prior Publication Data

US 2014/0215292 A1 Jul. 31, 2014

Related U.S. Application Data

(60) Provisional application No. 61/758,226, filed on Jan. 29, 2013.

(51) Int. Cl.
*H03M 13/00* (2006.01)
*H04L 1/00* (2006.01)
*H03M 13/37* (2006.01)
*H03M 13/11* (2006.01)

(52) U.S. Cl.
CPC ............ *H04L 1/0057* (2013.01); *H03M 13/11* (2013.01); *H03M 13/3761* (2013.01); *H04L 1/0009* (2013.01)

(58) Field of Classification Search
CPC . H03M 13/11; H03M 13/25; H03M 13/3761; H04L 1/0009; H04L 1/0057
See application file for complete search history.

(56) References Cited

U.S. PATENT DOCUMENTS

| | | | | |
|---|---|---|---|---|
| 7,418,651 B2 * | 8/2008 | Luby | ...................... | H03M 13/29 714/800 |
| 2012/0317461 A1 * | 12/2012 | Hwang | ............. | H03M 13/6547 714/776 |

OTHER PUBLICATIONS

Luby, Michael, LT Codes, May 2011, Digital Fountain, Inc, pp. 1 to 10 (retrieved from Google.com Nov. 23, 2015).*
Montalban et al., Efficiency comparison of LDPC-LDGM and Raptor codes for PL-FEC with very large block sizes, 2009, IEEE, pp. 1 to 6.*

* cited by examiner

*Primary Examiner* — Shelly A Chase
(74) *Attorney, Agent, or Firm* — Norton Rose Fulbright US LLP

(57) ABSTRACT

Systems and methods for encoding data for transmission over a communications channel using an improved LT staircase FEC code are provided. Embodiments may include mapping source symbols to repair symbols, wherein a number of edges of the mapping associated with a source symbol is determined randomly according to a first distribution. The repair symbols may be ordered, and at least a first repair symbol may be encoded based on the source symbols that map to the first repair symbol and/or another repair symbol that immediately precedes the first repair symbol in the ordering of the repair symbols.

20 Claims, 8 Drawing Sheets

LT STAIRCASE FEC CODE

PRIORITY AND RELATED APPLICATIONS STATEMENT

This application claims the benefit of U.S. Provisional Patent Application No. 61/758,226 entitled "IMPROVED LT STAIRCASE FEC CODE," filed Jan. 29, 2013, which is expressly incorporated by reference herein in its entirety.

DESCRIPTION OF THE RELATED ART

More and more content is being transferred over available communication networks. This content generally includes numerous types of data including, for example, audio data, video data, image data, etc. Because of the physical limitations in transferring content from a sender to a receiver over a channel, the received data is often not identical to the transmitted data. For example, most all physically realizable communications systems utilize a channel that does not have perfect fidelity, causing errors (i.e., data that has changed from one side of the channel to the other) and erasures (i.e., data that has disappeared in transit or been discarded).

When a reverse channel from the receiver to the sender is available, the receiver may recover the transmitted data despite the channel imperfections by requesting retransmission of data when data is believed to be erased or in error. Often times, however, a reverse channel is costly or impractical. For example, when the sender is transmitting a large data file or streaming content to a large number of receivers, the sender may not be able to handle reverse channels from all the receivers. As another example, for a mobile receiver capable of sending and receiving data over a wireless network, it is often the case that the reverse channel is substantially more limited in bandwidth capacity than the forward channel from the sender to the mobile receiver. In addition, often times it takes significantly more power to send each bit of data from the mobile receiver over the reverse channel than it takes the mobile receiver to receive each bit of data from the forward channel. Therefore, a reverse channel may not be a viable solution for data recovery in most applications.

The problem of data transmission between senders and receivers is made more difficult when the receivers need to be low-power, small devices that might be portable or mobile and need to receive data at high bandwidths. For example, a wireless network might be set up to deliver files or streams from a sender to a large or indeterminate number of portable or mobile receivers either as a broadcast or multicast where the receivers are constrained in their computing power, memory size, available electrical power, antenna size, device size and other design constraints. Another example is in storage applications where the receiver retrieves data from a storage medium which exhibits less than ideal fidelity in reproduction of the original data. Such receivers are often embedded with the storage medium itself in devices, for example disk drives, which are highly constrained in terms of computing power and electrical power.

SUMMARY

According to one embodiment, data transmission may be improved by encoding the data for transmission over a communications channel using an improved Luby transform (LT) staircase Forward Error Correction (FEC) code. In one embodiment, a method of encoding data for transmission over a communications channel may include mapping a first plurality of symbols to a second plurality of symbols according to a first distribution algorithm, wherein a number of edges of the mapping associated with a symbol in the first plurality of symbols is determined randomly according to the first distribution algorithm. The method may also include ordering the second plurality of symbols. The method may further include encoding a first symbol in the second plurality of symbols based on at least one of one or more values of one or more symbols in the first plurality of symbols that map to the first symbol and an encoded value of a second symbol in the second plurality of symbols, wherein the second symbol immediately precedes the first symbol in the ordering of the second plurality of symbols.

In another embodiment, an apparatus for encoding data for transmission over a communications channel may include a means for mapping a first plurality of symbols to a second plurality of symbols according to a first distribution algorithm, wherein a number of edges of the mapping associated with a symbol in the first plurality of symbols is determined randomly according to the first distribution algorithm. The apparatus may also include a means for ordering the second plurality of symbols. The apparatus may further include a means for encoding a first symbol in the second plurality of symbols based on at least one of one or more values of one or more symbols in the first plurality of symbols that map to the first symbol and an encoded value of a second symbol in the second plurality of symbols, wherein the second symbol immediately precedes the first symbol in the ordering of the second plurality of symbols.

In yet another embodiment, a computer program product for encoding data for transmission over a communications channel may include a non-transitory computer-readable medium having program code to map a first plurality of symbols to a second plurality of symbols according to a first distribution algorithm, wherein a number of edges of the mapping associated with a symbol in the first plurality of symbols is determined randomly according to the first distribution algorithm. The medium may also include program code to order the second plurality of symbols. The medium may further include program code to encode a first symbol in the second plurality of symbols based on at least one of one or more values of one or more symbols in the first plurality of symbols that map to the first symbol and an encoded value of a second symbol in the second plurality of symbols, wherein the second symbol immediately precedes the first symbol in the ordering of the second plurality of symbols.

According to another embodiment, a method for decoding data transmitted over a communications channel may include receiving one or more transmitted symbols, wherein a first symbol from a first plurality of symbols is received, a second symbol from the first plurality of symbols that immediately precedes the first symbol in an ordering of the first plurality of symbols is not received, and a third symbol from the first plurality of symbols that immediately precedes the second symbol in the ordering of the first plurality of symbols is received. The method may also include decoding the received one or more transmitted symbols to recover one or more symbols in a second plurality of symbols based, at least in part, on the values of the first received symbol and the third received symbol, wherein the second plurality of symbols are mapped to the first plurality of symbols according to a first distribution algorithm.

In one embodiment, an apparatus configured for decoding data transmitted over a communications channel may include a means for receiving one or more transmitted symbols, wherein a first symbol from a first plurality of symbols is received, a second symbol from the first plurality of symbols that immediately precedes the first symbol in an ordering of the first plurality of symbols is not received, and a third symbol from the first plurality of symbols that immediately precedes the second symbol in the ordering of the first plurality of symbols is received. The apparatus may also include a means for decoding the received one or more transmitted symbols to recover one or more symbols in a second plurality of symbols based, at least in part, on the values of the first received symbol and the third received symbol, wherein the second plurality of symbols are mapped to the first plurality of symbols according to a first distribution algorithm.

In yet another embodiment, a computer program product for decoding data transmitted over a communications channel may include a non-transitory computer-readable medium having program code to receive one or more transmitted symbols, wherein a first symbol from a first plurality of symbols is received, a second symbol from the first plurality of symbols that immediately precedes the first symbol in an ordering of the first plurality of symbols is not received, and a third symbol from the first plurality of symbols that immediately precedes the second symbol in the ordering of the first plurality of symbols is received. The medium may also include program code to decode the received one or more transmitted symbols to recover one or more symbols in a second plurality of symbols based, at least in part, on the values of the first received symbol and the third received symbol, wherein the second plurality of symbols are mapped to the first plurality of symbols according to a first distribution algorithm.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures for carrying out the same purposes of the present disclosure. It should also be realized by those skilled in the art that such equivalent constructions do not depart from the spirit and scope of the disclosure as set forth in the appended claims. The novel features which are believed to be characteristic of the disclosure, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the disclosed system and methods, reference is now made to the following descriptions taken in conjunction with the accompanying drawings.

DETAILED DESCRIPTION

Figure 1:
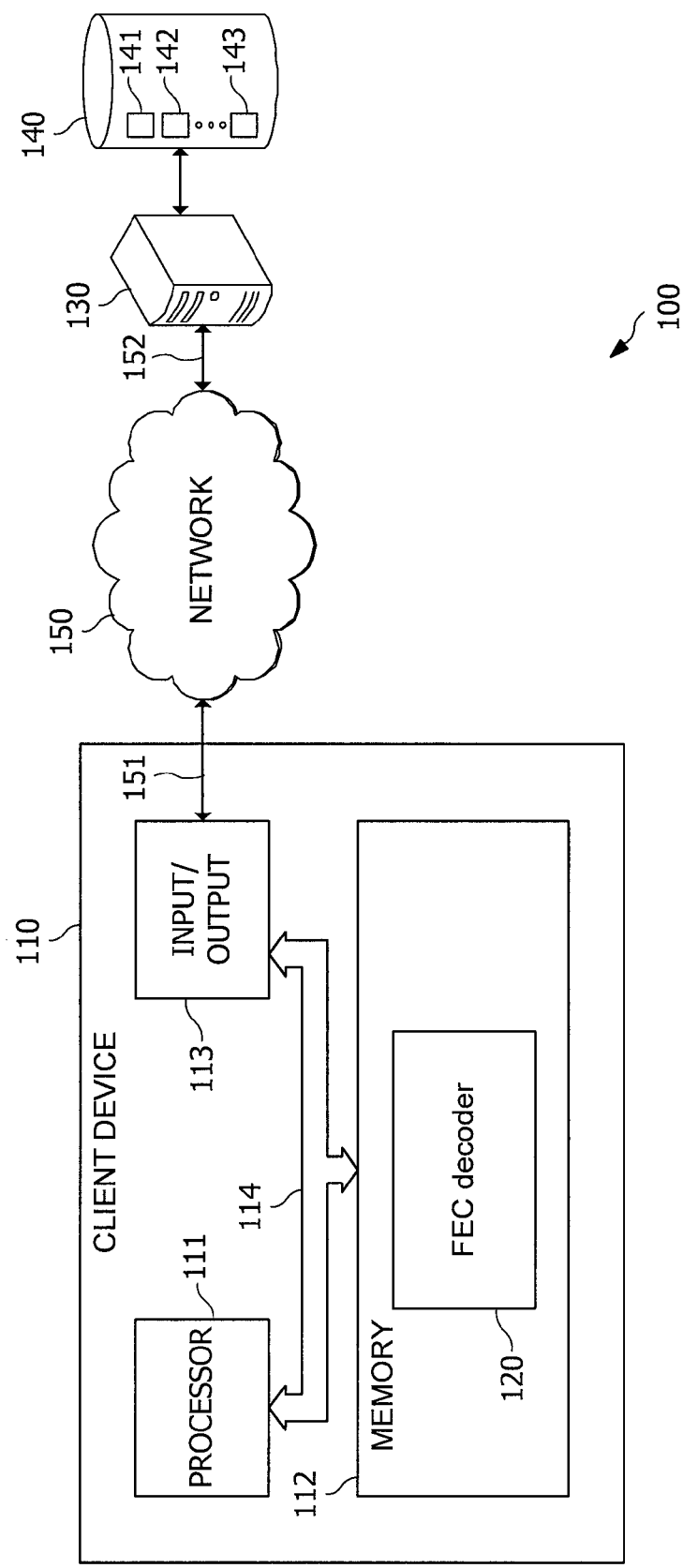
FIG. 1 shows a system adapted for data transmission according to one embodiment of the present disclosure.

The word "exemplary" is used herein to mean "serving as an example, instance, or illustration." Any aspect described herein as "exemplary" is not necessarily to be construed as preferred or advantageous over other aspects.

In this description, the term "application" may also include files having executable content, such as: object code, scripts, byte code, markup language files, and patches. In addition, an "application" referred to herein, may also include files that are not executable in nature, such as documents that may need to be opened or other data files that need to be accessed.

As used in this description, the term "content" may include data having video, audio, combinations of video and audio, or other data at one or more quality levels, the quality level determined by bit rate, resolution, or other factors. The content may also include executable content, such as: object code, scripts, byte code, markup language files, and patches. In addition, "content" may also include files that are not executable in nature, such as documents that may need to be opened or other data files that need to be accessed.

As used in this description, the term "streaming content" refers to content that may be sent from a server device and received at a user device according to one or more standards that enable the real-time transfer of content or transfer of content over a period of time. Examples of streaming content standards include those that support de-interleaved (or multiple) channels and those that do not support de-interleaved (or multiple) channels.

As used in this description, the terms "component," "database," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

As used herein, the terms "user equipment," "user device," and "client device" include devices capable of requesting and receiving content from a server, such as, for example, a web server, and transmitting information to the server. Such devices can be stationary devices or mobile devices. The terms "user equipment," "user device," and "client device" can be used interchangeably.

As used herein, the term "user" refers to an individual receiving content on a user device or on a client device and transmitting information via the client device.

FIG. 1 shows a system 100 adapted according to the concepts herein to provide transfer of content, such as may comprise audio data, video data, image data, file data, etc., over communication networks. Accordingly, client device 110 is shown in communication with server 130 via network 150, whereby server 130 may transfer various content stored in database 140 to client device 110 in accordance with the concepts of the present disclosure. It should be appreciated that, although only a single client device and a single server and database are represented in FIG. 1, system 100 may comprise a plurality of any or all such devices. For example, server 130 may comprise a server of a server farm, wherein a plurality of servers may be disposed centrally and/or in a distributed configuration, to serve high levels of demand for content transfer. Likewise, users may possess a plurality of client devices and/or a plurality of users may each possess one or more client devices, any or all of which are adapted for content transfer according to the concepts herein.

Client device 110 may comprise various configurations of devices operable to receive transfer of content via network 150. For example, client device 110 may comprise a wired device, a wireless device, a personal computing device, a tablet or pad computing device, a portable cellular telephone, a WiFi enabled device, a Bluetooth enabled device, a television, a pair of glasses having a display, a pair of augmented reality glasses, or any other communication, computing or interface device connected to network 150 which can communicate with server 130 using any available methodology or infrastructure. Client device 110 is referred to as a "client device" because it can function as, or be connected to, a device that functions as a client of server 130.

Client device 110 of the illustrated embodiment comprises a plurality of functional blocks, shown here as including processor 111, memory 112, and input/output (I/O) element 113. Although not shown in the representation in FIG. 1 for simplicity, client device 110 may comprise additional functional blocks, such as a user interface, a radio frequency (RF) module, a camera, a sensor array, a display, a video player, a browser, etc., some or all of which may be utilized by operation in accordance with the concepts herein. The foregoing functional blocks may be operatively connected over one or more buses, such as bus 114. Bus 114 may comprise the logical and physical connections to allow the connected elements, modules, and components to communicate and interoperate.

Memory 112 can be any type of volatile or non-volatile memory, and in an embodiment, can include flash memory. Memory 112 can be permanently installed in client device 110, or can be a removable memory element, such as a removable memory card. Although shown as a single element, memory 112 may comprise multiple discrete memories and/or memory types.

Memory 112 may store or otherwise include various computer readable code segments, such as may form applications, operating systems, files, electronic documents, content, etc. For example, memory 112 of the illustrated embodiment comprises computer readable code segments defining Forward Error Correction (FEC) decoder 120, which when executed by a processor (e.g., processor 111) provides logic circuits operable as described herein. The code segments stored by memory 112 may provide applications in addition to the aforementioned FEC decoder 120. For example, memory 112 may store applications such as a browser, useful in accessing content from server 130 according to embodiments herein. Such a browser can be a web browser, such as a hypertext transfer protocol (HTTP) web browser for accessing and viewing web content and for communicating via HTTP with server 130 over connections 151 and 152, via network 150, if server 130 is a web server. As an example, an HTTP request can be sent from the browser in client device 110, over connections 151 and 152, via network 150, to server 130. A HTTP response can be sent from server 130, over connections 152 and 151, via network 150, to the browser in client device 110. In another embodiment, the User Datagram Protocol (UDP) packet protocol can be used as the underlying transport protocol for accessing and viewing content. In addition to the aforementioned code segments forming applications, operating systems, files, electronic documents, content, etc., memory 112 may include or otherwise provide various registers, buffers, and storage cells used by client device 110.

FEC decoder 120 is adapted according to concepts herein to decode FEC encoded data. For example, server 130 of the embodiments herein may comprise an FEC encoder component (not shown) to FEC encode data, such as, for example, data from database 140, or streaming content prior to being transmitted to client device 110 over connections 152 and 151, via network 150. In some embodiments, the FEC encoder component of server 130 may employ an improved Luby transform (LT) staircase FEC code to improve content recovery by client device 110 of content transmitted over connections 152 and 151, via network 150, as described further below. The computer readable code segments within memory 112 defining FEC decoder 120 may include information for how to decode the data encoded by server 130 and transmitted over connections 152 and 151, via network 150, to client device 110.

Processor 111 of embodiments herein can be any general purpose or special purpose processor capable of executing instructions to control the operation and functionality of client device 110. Although shown as a single element, processor 111 may comprise multiple processors, or a distributed processing architecture.

I/O element 113 can include and/or be coupled to various input/output components. For example, I/O element 113 may include and/or be coupled to a display, a speaker, a microphone, a keypad, a pointing device, a touch-sensitive screen, user interface control elements, and any other devices or systems that allow a user to provide input commands and receive outputs from client device 110. Any or all such components may be utilized to provide a user interface of client device 110. Additionally or alternatively, I/O element 113 may include and/or be coupled to a disk controller, a network interface card (NIC), a radio frequency (RF) transceiver, and any other devices or systems that facilitate input and/or output functionality of client device 110.

Server 130 comprises one or more systems operable to serve desired content to client devices. For example, server 130 may comprise a standard HTTP web server operable to stream content to various client devices via network 150. In another embodiment, server 130 may include a UDP-based streaming or content delivery server to stream or deliver content to various devices via network 150. Server 130 may include a content delivery platform comprising any system or methodology that can deliver content to user device 110. The content may be stored in one or more databases in communication with server 130, such as database 140 of the illustrated embodiment. Database 140 may be stored on server 130 or may be stored on one or more servers communicatively coupled to server 130. Content of database 140 may comprise various forms of data, such as video, audio, streaming text, and any other content that can be transferred to client device 110 over a period of time by server 130, such as live webcast content and stored media content.

Database 140 may comprise a plurality of different source or content files and/or a plurality of different representations of any particular content (e.g., high resolution representation, medium resolution representation, low resolution representation, etc.). For example, content file 141 may comprise a high resolution representation, and thus high bit rate representation when transferred, of a particular multimedia compilation while content file 142 may comprise a low resolution representation, and thus low bit rate representation when transferred, of that same particular multimedia compilation. Additionally or alternatively, the different representations of any particular content may comprise an FEC representation (e.g., a representation including redundant encoding of content data), such as may be provided by content file 143. A Uniform Resource Locator (URL), Uniform Resource Identifier (URI), and/or Uniform Resource Name (URN) may be associated with all of these content files according to embodiments herein, and thus such URLs, URIs, and/or URNs may be utilized, perhaps with other information such as byte ranges, for identifying and accessing requested data.

Network 150 can be a wireless network, a wired network, a wide area network (WAN), a local area network (LAN), or any other network suitable for the transfer of content as described herein. In an embodiment, network 150 can comprise at least portions of the Internet. Client device 110 can be connected to network 150 over a bi-directional connection, such as is represented by network connection 151. The connection can be a wired connection or can be a wireless connection. In an embodiment, connection 151 can be a wireless connection, such as a cellular 4G connection, a wireless fidelity (WiFi) connection, a Bluetooth connection, or another wireless connection. Server 130 can be connected to network 150 over a bi-directional connection, such as represented by network connection 152. The connections can be unidirectional, for example, using a Multimedia Broadcast Multicast Services (MBMS) enabled network, as described, for example, in the 3rd Generation Partnership Project (3GPP) Technical Specification (TS) 26.346, or any other broadcast or multicast network. The connection can be a wired connection or can be a wireless connection.

Figure 2:
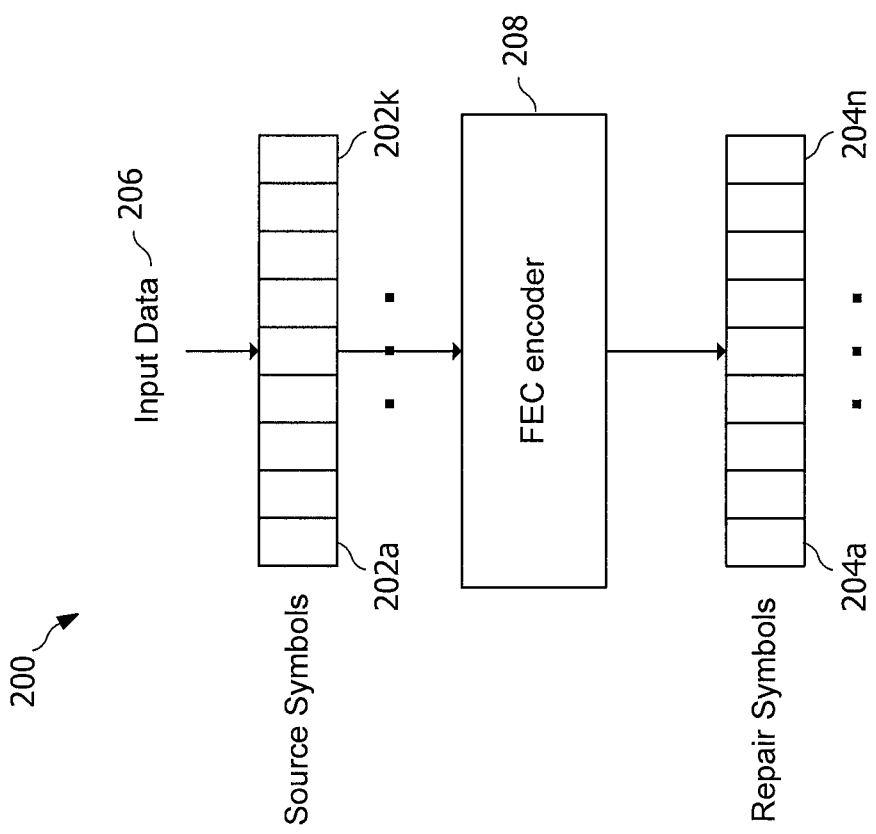
FIG. 2 shows a schematic block diagram illustrating input data being represented as source symbols and the source symbols being processed by an FEC encoder to generate repair symbols according to one embodiment of the present disclosure.

FIG. 2 shows a schematic block diagram illustrating input data being represented as source symbols and the source symbols being processed by an FEC encoder to generate repair symbols according to one embodiment of the present disclosure. According to an embodiment, the input data 206 may be provided from a database, such as, for example, database 140 of FIG. 1, from a content provider, or from another source of content to a sender, such as, for example, server 130 of FIG. 1. It should be appreciated that in some embodiments a device may include functionality allowing it to function as both a sender and a receiver. The input data 206 may be represented within the sender as a source block 202 comprising a number K of source symbols 202a-202k, in which the input data 206 is partitioned into the K source symbols 202a-202k. In some embodiments, the input data 206 may be provided to the sender as K input source symbols, where K may or may not be known in advance, as is the case with some content streaming applications. Although the embodiment of FIG. 2 shows the input data 206 being represented by one source block 202, the input data 206 may, in general, be partitioned into a plurality of source blocks which may be further partitioned into one or more source symbols, wherein each source block has the same properties as source block 202 of FIG. 2.

FEC encoder 208 may process the K source symbols 202a-202k to generate a number N of repair symbols 204a-204n, as described further below. In one embodiment, each of the K source symbols 202a-202k may be of the same length T in bits or bytes, and the resulting N repair symbols 204a-204n are also each T bits or bytes in length. In general, a sender includes the software and/or hardware functionality to perform the partitioning of input data 206 into one or more source blocks, the FEC encoding by an FEC encoder 208 module, and the generation of repair symbols.

FEC generally refers to encoding data with a level of redundancy in anticipation of errors/erasures in advance of any errors/erasures actually occurring to allow a receiver to recover at least a portion of the originally-transmitted data. FEC encoding may be rateless or may be associated with a fixed rate depending on the implementation details of the FEC scheme. When an FEC scheme is associated with a fixed rate, the number R of symbols transmitted by the sender over a network may be determined by the number of source symbols encoded. The code rate may be defined as K/R, where K is the number of source symbols encoded with the FEC scheme and R is the number of symbols transmitted by the sender over a network. In some embodiments, R=K+N, which therefore includes a copy of the K input symbols plus N repair symbols. When the FEC encoding scheme is rateless, the encoding process does not require a fixed code rate K/R. For example, with LT encoding or Raptor™ encoding, the number of R output symbols might be determined by the resolution of a key counter and not necessarily the number of input symbols. For example, if K=1,000 and a 32-bit key counter is used, 2^32 different keys can be generated, so 2^32 different output symbols can be generated. In most situations, 2^32 output symbols may not be needed to convey the information content of 1,000 input symbols. Thus, the ratio of input symbols to output symbols would vary according to how many output symbols are generated and/or needed.

Figure 3:
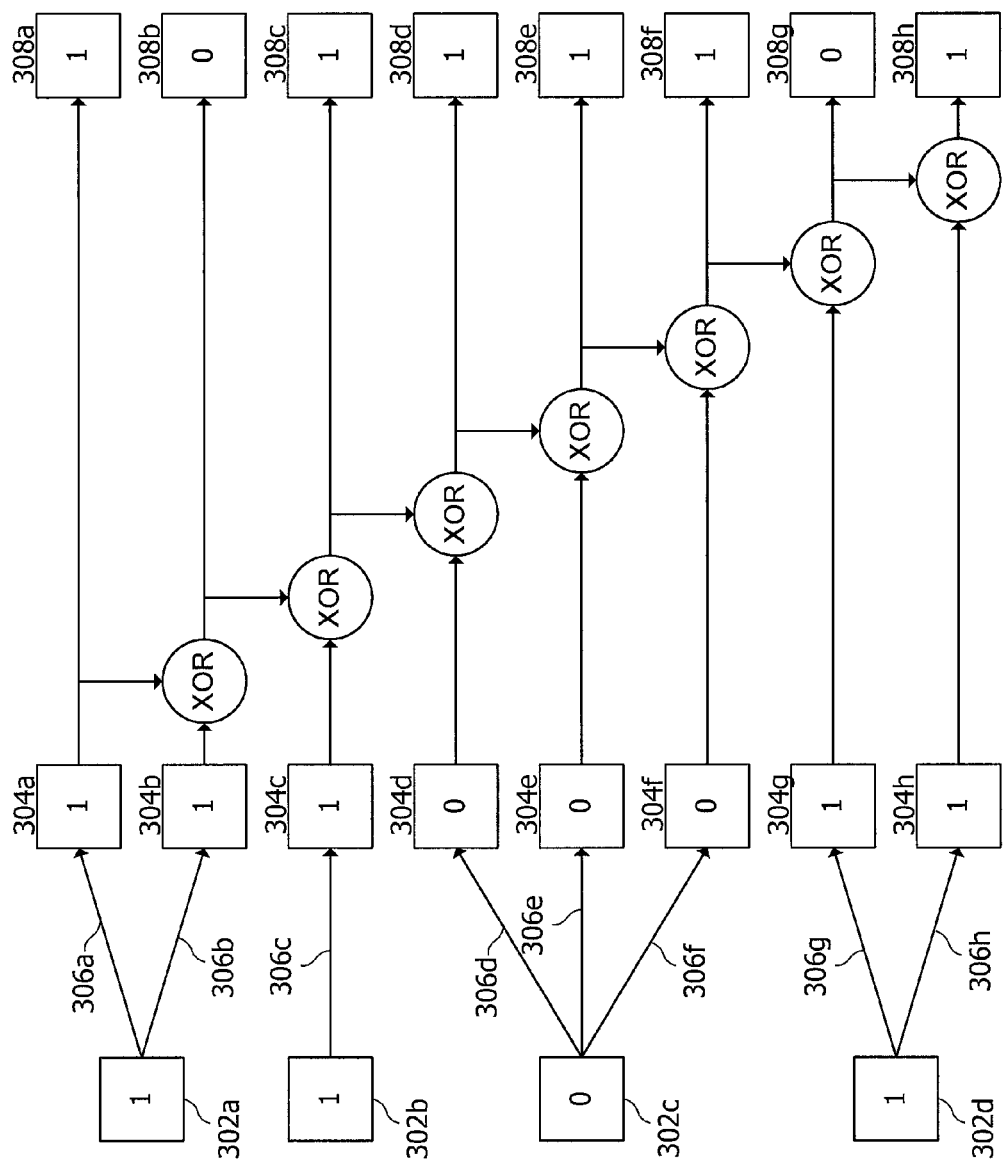
FIG. 3 shows a schematic block diagram illustrating FEC encoding according to one embodiment of the present disclosure.

FIG. 3 shows a schematic block diagram illustrating FEC encoding according to one embodiment of the present disclosure. More specifically, FIG. 3 shows an improved LT staircase FEC coding scheme according to one embodiment of the disclosure. According to the embodiment of FIG. 3, FEC encoding may include mapping a first plurality of symbols 302a-302d to a second plurality of symbols 304a-304h according to a distribution algorithm. For example, the first plurality of symbols 302a-302d may be K source symbols, where K=4, and the second plurality of symbols 304a-304h may be N repair symbols, where N=8. According to one embodiment, the K source symbols 302a-302d are mapped to the N repair symbols 304a-304h using a bipartite graph mapping for which the edges 306a-306h of the bipartite graph mapping are defined according to the distribution algorithm. Therefore, the number of edges of the mapping associated with a given source symbol 302a-302d and associated with a given repair symbol 304a-304h may be determined in accordance with the distribution algorithm. In some embodiments, the distribution algorithm may be chosen such that the number of edges of the mapping associated with a given source symbol 302a-302d is determined randomly according to a source degree distribution and the number of edges of the mapping associated with a given repair symbol 304a-304h is determined according to a repair degree distribution.

As used herein, the number of edges that connect to a symbol node, regardless of whether the node is a source symbol or a repair symbol, is referred to as the "degree" of the symbol node. Hence, the degree of a given source symbol is equivalent to the number of edges of the mapping associated with the given source symbol, and similarly the degree of a given repair symbol is equivalent to the number of edges of the mapping associated with the given repair symbol. According to the embodiment of FIG. 3, the repair degree distribution has the property that each repair symbol 304a-304h has degree one, and this is thus an example of a non-random repair degree distribution where each repair symbol has the same degree. As illustrated in FIG. 3, the degrees of the source symbols 302a-302d may be drawn from a source degree distribution where different source symbols have different degrees. For example, and not limitation, source symbol 302a has degree two with a first edge 306a to repair symbol 304a and a second edge 306b to repair symbol 304b, source symbol 302b has degree one, source symbol 302c has degree three and source symbol 302d has degree two. In general, the source and repair degree distributions may be random or deterministic or pseudo-random, and the mapping of edges between the source symbols and repair symbols defined by the source and repair degree distributions may be random or deterministic or pseudo-random.

In general, a distribution algorithm may determine a source degree distribution and a repair degree distribution with the property that the sum of the degrees of the source symbols E is equal to the sum of the degrees of the repair symbols. Furthermore, the distribution algorithm may define the mapping of the E edges from the source symbols to the repair symbols. In some embodiments, the mapping of the E edges between the source symbols and repair symbols can be determined based on the source degree distribution and repair symbol degree distribution. For example, an edge mapping between source symbols and repair symbols can be determined as follows based on the degrees of the source symbols and repair symbols. The K source symbols are ordered from 1 to K, the E edges are ordered from 1 to E and the source symbol endpoints of the edges are assigned consecutively to the source symbols in the order of the source symbol ordering and the edge ordering with each source symbol assigned their degree number of edges. The N repair symbols are ordered from 1 to N, a permutation pi of 1 to E of the edges may be chosen, and the repair symbol endpoints of the edges are assigned consecutively to the repair symbols in the order of the repair symbol ordering and the edge ordering pi with each repair symbol assigned their degree number of edges. In some embodiments the edge ordering pi may be chosen uniformly at random from all possible permutations, in other embodiments the edge ordering pi may be chosen pseudo-randomly, and in other embodiments the edge ordering pi may be chosen deterministically. In some embodiments, the edge ordering pi may be chosen independently of the degree of source and repair symbol degrees, and in other embodiments the edge ordering pi may be chosen so that there is a correlation between the degrees of the end points of the edges. For example, edges that have an endpoint at a higher degree source symbol also tend to have as their other end point a higher degree repair symbol.

In one embodiment, mapping source symbols to repair symbols according to a distribution algorithm using a bipartite graph mapping may include mapping each symbol in a first portion of the source symbols to a first number of repair symbols and mapping each symbol in a second portion of the source symbols to a second number of repair symbols. Thus, each symbol in the first portion of source symbols may have the first number as its degree, and each symbol in the second portion of source symbols may have the second number as its degree. Generally, a portion of source symbols may include one or more source symbols. In some embodiments, the first number of repair symbols and the second number of repair symbols may be the same. More specifically, the degree of source symbols in the first and second portions of source symbols may be the same. In other embodiments, the first number of repair symbols and the second number of repair symbols may be different and may differ by at least one, two, or more. More specifically, the degree of source symbols in the first portion may be different, by at least one, two or more, from the degree of source symbols in the second portion.

According to one embodiment, the bipartite graph mapping may be made available to a receiver or a sender in the form of a data structure stored in memory within the receiver or sender, respectively. In another embodiment, the bipartite graph mapping may be made available in the form of instructions stored in memory within a receiver or a sender, in which the instructions may be executed to determine the edges as needed.

According to one embodiment, an LT-type distribution may be used to define edges for a bipartite graph mapping. Using such a distribution to determine a source degree distribution, the degree of each source symbol may be chosen randomly to be I with probability proportional to $1/(I*(I-1))$ up to a maximum degree D. For example, when the maximum degree D=100, a source symbol would have a degree of 2 with probability of ½, a degree of 3 with probability of ⅙, etc., and a 1/D probability of having a maximum degree D. That is, the fraction of symbols with degree 2 is approximately ½, and the fraction of symbols with degree 3 is approximately ⅙. The maximum degree may incorporate the distribution for all degrees greater than D, which may be a total probability of about 1/D. Although a probability proportional to $1/(I*(I-1))$ may not allow for source symbols to have a degree of 1, setting a few source symbols to have a degree equal to 1 may still be useful in some embodiments.

In one embodiment, a distribution similar to the aforementioned LT-type distribution may be implemented by employing an algorithm in which a random number, X, uniformly between 0 and 1, is independently chosen for each source symbol and then the degree of a source symbol is set to the minimum of ceiling(1/X) and D, where ceiling(1/X) is the smallest integer that is at least as large as 1/X and where D may be the maximum degree. According to one embodiment, when K source symbols are encoded, the total number of edges E defined in this manner may be approximately equal to $K*\ln(D)$.

An example of a repair degree distribution, that in particular can be used in conjunction with an LT-type source degree distribution, is one in which every repair symbol has the average degree E/N rounded up or down to the nearest integer in such a way that the sum of the degrees of the repair symbols is E. As a preferred embodiment, the number of repair symbols N can be set to E, and then each repair symbol has degree one. The edges between the source symbols and the repair symbols can be chosen using the aforementioned methods for determining the mapping of the edges between the source symbols and the repair symbols.

After the edges between the source symbols 302a-302d and the repair symbols 304a-304h have been defined according to a degree distribution algorithm, the repair symbols may be ordered to keep track of which repair symbols neighbor which repair symbols and to aid in the additional processing of the repair nodes 304a-304h to obtain the final values 308a-308h corresponding to repair nodes 304a-304h. As an example of the further encoding (e.g., processing), the further encoding of repair node 304d will be described based on its intermediate value 304d, and it may be readily obvious that the remaining repair nodes 304a-304c and 304e-304h may be further processed in a manner similar to the additional processing described for repair node 304d. When the additional encoding is completed, the final value of the repair node 308d may or may not have the same value as the intermediate value of the repair node 304d.

According to one embodiment, encoding may include determining an intermediate value for the repair node 304d. When only one of the source symbols 302a-302d maps to repair node 304d, then the intermediate value for the repair node 304d may simply be the value of the source symbol 302c that maps to repair node 304d. When more than one source symbol maps to a repair node, then the intermediate value for the repair node may be the exclusive disjunction (XOR) of the values of these source symbols neighbors. Therefore, according to the embodiment of FIG. 3, the intermediate value of the repair node 304d is 0. Encoding repair node 304d to arrive at the final value 308d may include setting the repair node final value 308d to the value of the XOR of the intermediate value of the repair node 304d (i.e., 0) and the final value of the previous repair symbol 308c (i.e., 1). Therefore, according to an embodiment, the final value of the repair node 308d may be based on at least the source symbol 302c (or multiple source symbols if more than one source symbols maps to the repair node) that maps to the repair node 304d and/or the final encoded value of the repair node 308c that immediately precedes the repair node 304d in the ordering of the repair nodes 304a-304h. It is also apparent from the embodiment of FIG. 3 that the final encoded value of the repair node 308c may be based on at least the source symbol 302b that maps to the repair node 304c and/or the final encoded value of the repair node 308b that immediately precedes the repair node 304c in the ordering of the repair nodes 304a-304h. According to the embodiment of FIG. 3, the mapping of edges between source and repair symbols uses the permutation pi as the identity mapping, i.e., I maps to I for all I=1, . . . , E.

In all methods described herein, the XOR is one of many different operations that can be used. For example, operations over a finite field, e.g., Galois Field GF[256], can be used in place of the XOR operations. In this case, a field element of GF[256] could be associated with each edge, and then the intermediate value of the repair node can be the sum of each source symbol neighbor multiplied by the field element associated with the edge between that source symbol neighbor and the repair symbol, where the sum and multiplication are with respect to GF[256]. Furthermore, the final value of the repair node can be the sum of the final value of the preceding repair node multiplied by the field element associated with the repair node and the intermediate value of the repair node, where the sum and multiplication are with respect to GF[256]. The field elements associated with the edges and with the repair nodes may be generated using a deterministic or random or pseudo random process. Using GF[256] (or any other field) may provide higher reliability recovery of the source symbols compared to using XOR, but may require somewhat higher computational cost in the encoding and decoding processes.

Figure 4:
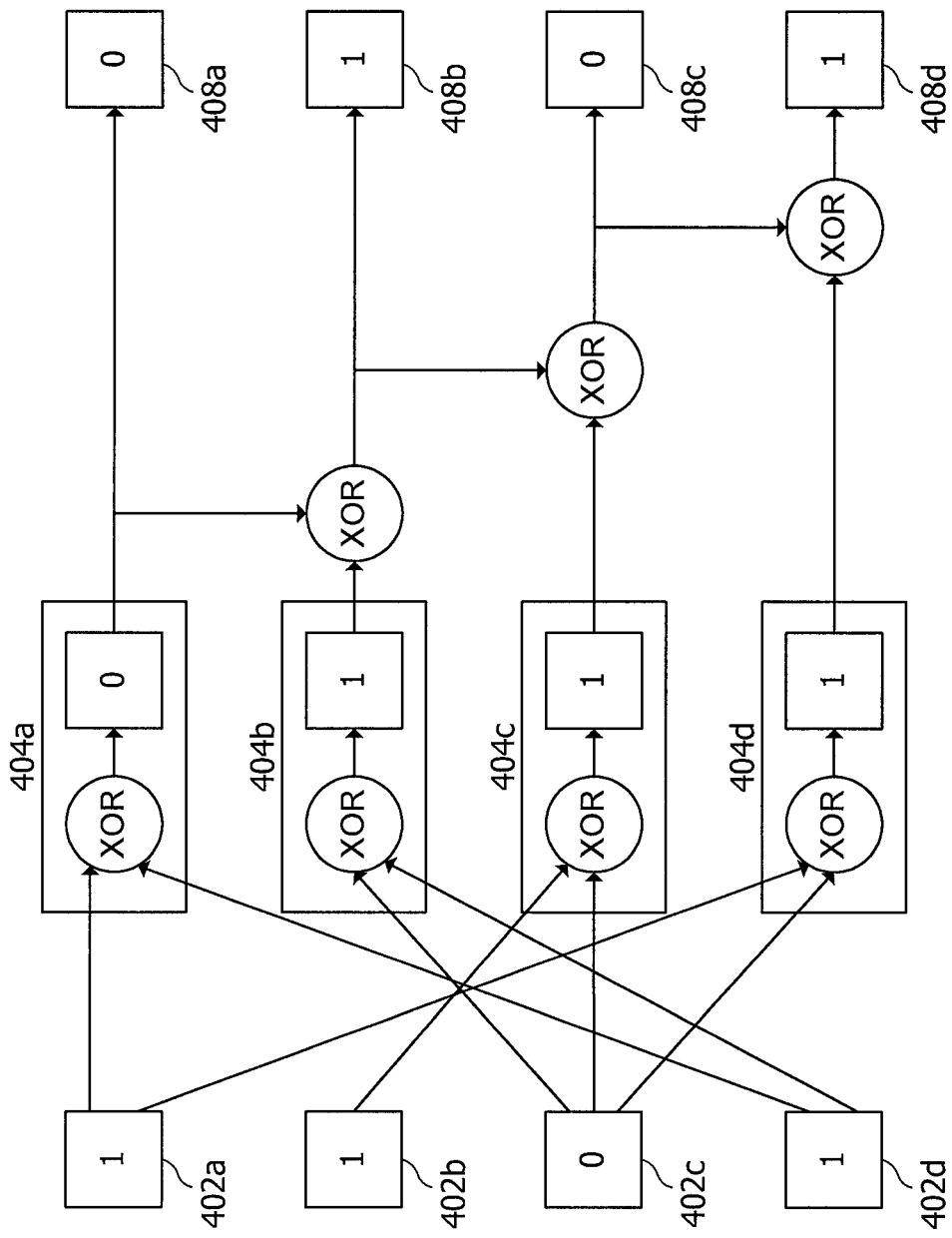
FIG. 4 shows another schematic block diagram illustrating FEC encoding according to one embodiment of the present disclosure.

FIG. 4 shows another schematic block diagram illustrating FEC encoding according to one embodiment of the present disclosure. In the embodiment of FIG. 4, each of the K=4 source symbol 402a-402d has the same degree as the K=4 source symbols 302a-302d of FIG. 3, whereas the N=4 repair symbols 404a-404d of FIG. 4 have degree 2. That is, in the embodiment of FIG. 4, there are half as many repair symbols but each repair symbol has twice the degree as was shown for the repair symbols in FIG. 3. However, instead of the identity edge mapping, the mapping of edges between source and repair symbols shown in FIG. 4 may use the permutation pi: {1, 2, 3, 4, 5, 6, 7, 8}→{1, 7, 4, 8, 3, 5, 2, 6}, where in this case the permutation pi may be chosen randomly. For example, source symbol 402a maps to the two repair symbols 404a and 404d, giving source symbol 402a an effective degree of 2. Similar to the embodiment of FIG. 3 wherein each repair node 304a-304h had a uniform degree of 1, each of the repair symbols 404a-404d of FIG. 4 have a uniform degree of 2. Therefore, similar to the embodiment of FIG. 3 wherein the source symbols 302a-302d had degrees determined randomly according to a source degree distribution while the repair nodes 304a-304h had uniform degrees, the source symbols 402a-402d of FIG. 4 may have degrees that may have been determined randomly according to a source degree distribution while the repair symbols 404a-404d have uniform degrees determined by a deterministic repair degree distribution.

A distinction between FIG. 4 and FIG. 3 arises in the secondary processing performed on the repair symbols 404a-404d after the bipartite graph mapping has been completed. For example, whereas the intermediate value for each repair symbol 304a-304h of FIG. 3 was equivalent to the source symbol 302a-302d that mapped to it because each repair symbol had degree 1, the intermediate value for each of the repair symbols 404a-404d of FIG. 4 is equal to the XOR of the source symbols 402a-404d that map to them. As an example, according to the embodiment of FIG. 4, the intermediate value for repair symbol 404a is equal to 0, while the intermediate values for repair symbols 404b-404d are 1.

Similar to FIG. 3, encoding the repair symbols 404a-404d to arrive at their corresponding final encoded values 408a-408d may then include setting the value of each of the final encoded values 408a-408d to the value of the XOR of the intermediate values for the repair symbols 404a-404d and the final encoded values of the preceding encoded repair symbols 408a-408d. For example, the final encoded value for the repair symbol 404c is equal to the XOR of its intermediate value (i.e., 1) and the final value of the preceding encoded repair symbol 408b (i.e., 1), resulting in the final encoded value for the encoded repair symbol 408c being equal to 0.

Figure 5:
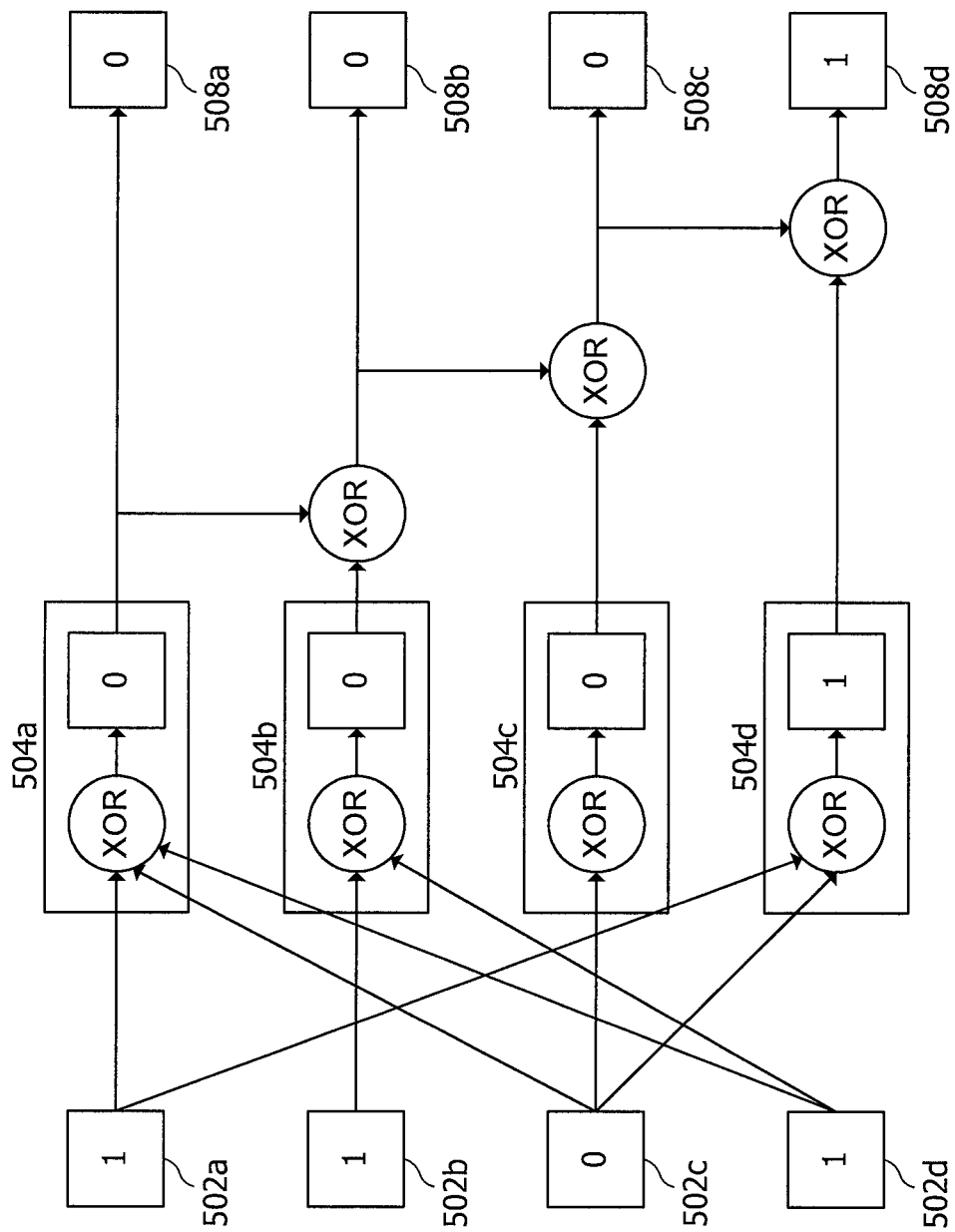
FIG. 5 shows yet another schematic block diagram illustrating FEC encoding according to one embodiment of the present disclosure.

FIG. 5 shows yet another schematic block diagram illustrating FEC encoding according to one embodiment of the present disclosure. In the embodiment of FIG. 5, each of the K=4 source symbol 502a-502d has the same degree as the corresponding K=4 source symbols 302a-302d of FIG. 3 and source symbols 402a-402d of FIG. 4. However, unlike the embodiments of FIG. 3 and FIG. 4 wherein each repair node 304a-304h had a uniform degree of 1 and 2, respectively, each of the repair symbols 504a-504d of FIG. 5 may also have a degree that is determined randomly according to a repair degree distribution where not all repair symbols have the same degree. Therefore, unlike the embodiments of FIG. 3 and FIG. 4, both the source symbols 502a-502d of FIG. 5 and the repair symbols 504a-504d of FIG. 5 may have degrees that may have been determined randomly according to one or more distributions. According to one embodiment, the repair degree distribution associated with each of the repair symbols 504a-504d may be Poisson randomly distributed.

In some embodiments, even when the number of edges of the mapping of FIG. 5 associated with a repair symbol 504a-504d is determined according to a distribution algorithm, the number of edges may still be the same for each of the repair symbols 504a-504d, thereby making the degree for each of the repair symbols 504a-504d equal, similar to the embodiments of FIGS. 3-4. In some embodiments, the uniform degree for each of the repair symbols 504a-504d may be equal to one or 10.

The subsequent encoding of the repair symbols 504a-504d to arrive at their corresponding encoded/recomputed repair symbols 508a-508d may follow a similar process as that disclosed for the embodiment of FIG. 4. As an example, the intermediate value for repair symbol 504b may be the XOR of the values of source symbols 502b and 502d, and the final encoded value for the repair symbol 508b is equal to the XOR of its intermediate value (i.e., 0) and the final value of the preceding encoded repair symbol 508a (i.e., 0), resulting in the final encoded value for encoded repair symbol 508b being equal to 0.

Figure 6:
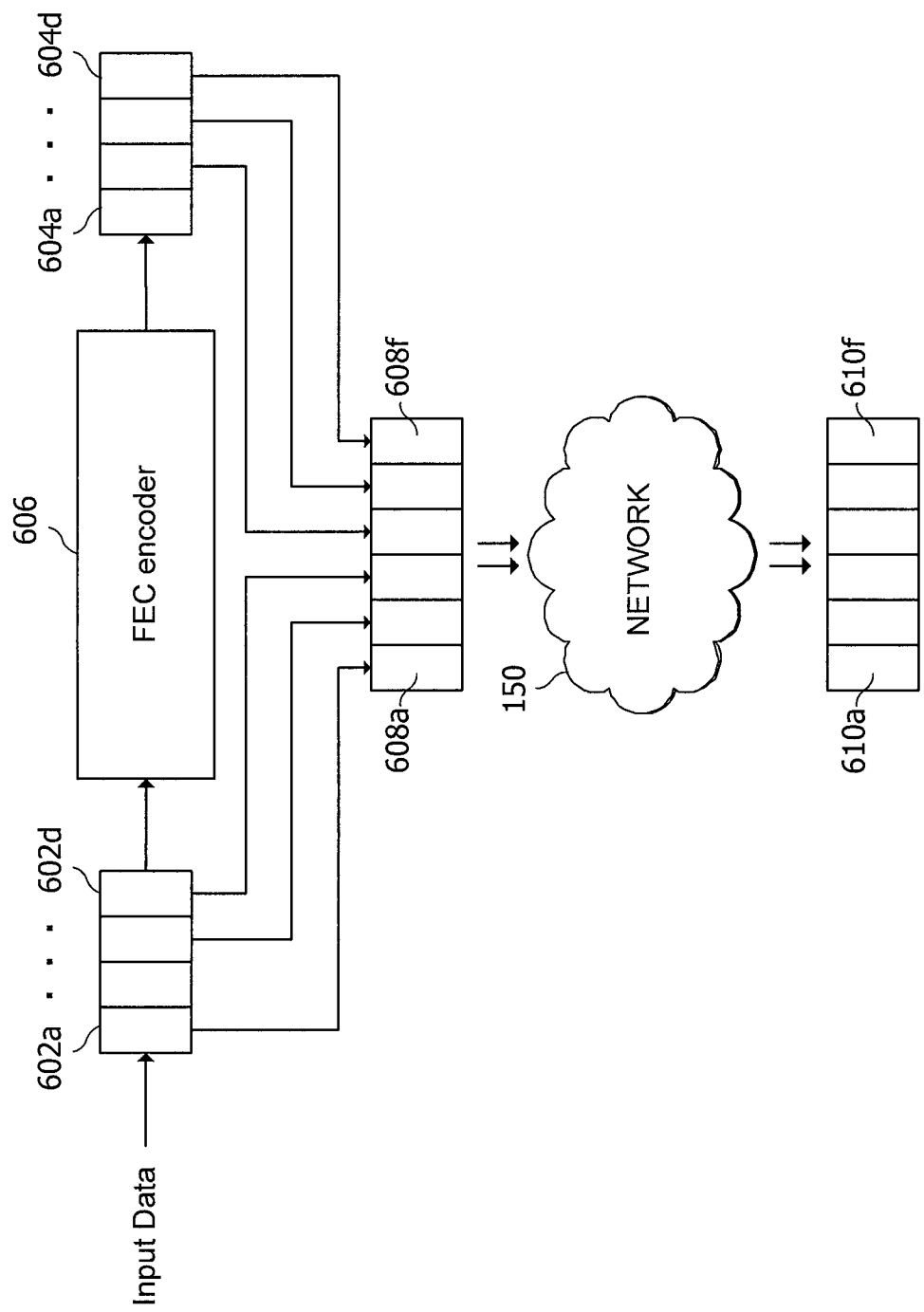
FIG. 6 shows a schematic block diagram illustrating transmission and receipt of source symbols and repair symbols transmitted over a network according to one embodiment of the present disclosure.

FIG. 6 shows a schematic block diagram illustrating transmission and receipt of source symbols and repair symbols transmitted over a network according to one embodiment of the present disclosure. As shown in FIG. 6, the source symbols 602a-602d are used by an FEC encoder 606 to generate repair symbols 604a-604d. FEC encoder 606 may utilize any of the aforementioned encoding schemes to generate repair symbols 604a-604d from source symbols 602a-602d. With the repair symbols 604a-604d generated, different combinations of source symbols 602a-602d and/or repair symbols 604a-604d may be transmitted by a sender (not shown) over network 150 to a receiver (not shown) where at least a portion of the transmitted symbols may be received.

Although the embodiment of FIG. 6 shows that the transmitted symbols 608a-608f include an equal number of source symbols 602a-602d and repair symbols 604a-604d, in general, the transmitted symbols 608a-608f from a sender to a receiver may include only source symbols 602a-602b, only repair symbols 604a-604d, or a combination of source symbols and repair symbols. While in one embodiment, the order in which the source symbols 602a-602d and/or the repair symbols 604a-604d are transmitted may correspond to the order of the source symbols 602a-602d and/or the repair symbols 604a-604d, in other embodiments the order in which the source symbols 602a-602d and/or the repair symbols 604a-604d are transmitted may be random. For example, according to one embodiment, transmitting repair symbols in a random order may include choosing a random permutation of the total number of repair symbols, and then sending the repair symbols (sending as many repair symbols as desired up to the total number of repair symbols) in this order. In general, there are many alternatives for transmitting at least repair symbols in a random order, including, for example, pseudorandom permutations or sending in a deterministic manner that emulates the statistics of sending in a random order. In one embodiment, the combination of source and/or repair symbols to be transmitted may be transmitted from one or more senders over network 150 and received by one or more receivers.

In some embodiments, the symbols to be transmitted (i.e., transmit symbols 608a-608f) may be assembled into one or more packets together with a packet header in each packet that identifies the encoded data within the packet. The assembled packets may then be transmitted from one or more senders to one or more receivers.

According to one embodiment, the received symbols 610a-610f may include at least a portion of the transmitted symbols 608a-608f. For example, in some embodiments, a portion of the transmitted symbols 608a-608f may have been erased in transit. In other embodiments, some of the portion of transmitted symbols 608a-608f that are received may include errors, thereby further reducing the amount of valid data symbols reliably received.

In some embodiments, using the FEC encoding scheme described herein, source symbols that map to a repair symbol that is not received by the receiver may still be recovered even if the source symbols were not received as well. For example, in one embodiment, repair symbols 604a-604d may have an ordering that is used during encoding, which in general may be a different ordering than the sending ordering of repair symbols 604a-604d, and furthermore not all of the repair symbols generated during encoding may be sent. The transmit symbols 608a-608f may then include source symbols 602a and 602c-602d and repair symbols 604b-604d. However, received symbols 610a-610f may include all the correct transmitted symbols 608a-608f except that transmitted symbol 608e may not be received because it is an erased symbol. Thus, symbols 610a-610d and 610f corresponding to 608a-608d and 608f, respectively, are received, whereas symbol 610e corresponding to transmitted symbol 608e is not received. Repair symbol 604d may be received while the preceding repair symbol 604c with respect to the ordering used for encoding may not be received. Additionally, transmitted repair symbol 604b, which may precede repair symbol 604c in the encoding ordering of repair symbols 604a-604d, may also be received. Although repair symbol 604c is not received, either because it was not transmitted or because it was transmitted and lost in transit, the receiver may still decode not received source symbol neighbors of not received repair symbols to recover one or more of the not received source symbols 602a-602d.

In one embodiment, decoding may include determining the XOR of the values of the source symbols 602a-602d that map to repair symbol 604d and the values of the source symbols 602a-602d that map to repair symbol 604c that was not received by the receiver. For example, the XOR of received repair symbol 604d and received repair symbol 604b results in the same value as the XOR of the values of the source symbols 602a-602d that map to repair symbol 604d and the values of the source symbols 602a-602d that map to repair symbol 604c that was not received by the receiver. That is, because each repair symbol of the generated repair symbols 604a-604d depends on each of the repair symbols that precedes it, at least one of the source symbols that is mapped to the repair symbol 604c that was not received may be recovered based, at least in part, on the values of repair symbol 604b and repair symbol 604d.

By using the FEC encoding/decoding schemes disclosed herein, a receiver may be able to recover all of the K input source symbols with some probability from reception of only slightly more than K transmitted symbols, and in some embodiments from reception of K transmitted symbols. The probability typically gets closer to 1 (certainty) as the ratio of the number of received symbols to source symbols gets larger than 1. In some instances, a probability of full recovery of K input symbols from R received symbols might exceed $1-10^{-7}$ for an R that is only 3% to 5% greater than K.

In some embodiments in which, at the receiver, there are M missing source symbols (and thus K-M received source symbols) and there are L received repair symbols, where L is approximately M (preferably L slightly larger than M if complete recovery is desired) in order to be able to recover all or most of the missing M source symbols from the L received repair symbols.

Suppose repair symbol J is received, and repair symbol J-I is the highest indexed previous repair symbol received, i.e., repair symbol J-I is received, but repair symbols J-I+1, J-I+2, . . . , J−1 are not received with respect to the encoding ordering of repair symbols. Then, an intermediate value for repair symbol J can be calculated as the XOR of the received value of repair symbol J and the received value of repair symbol J-I. By the properties of the staircase construction disclosed hereinabove, it can be seen that the intermediate value for repair symbol J is the XOR of the source symbol neighbors of repair symbols J-I+1, J-I+2, . . . , J-1, J. The influence of the received K-M source symbols can be immediately removed from the received repair symbols and have no further role in decoding. The dependencies on all of the received source symbols are removed from the intermediate value of J by XORing the received source symbol neighbors of repair symbols J-I+1, J-I+2, . . . , J-1, J into the intermediate value of J to result in a new intermediate value for repair symbol J, and the new intermediate value for repair symbol J may be the XOR of the missing (e.g., not received) source symbol neighbors of repair symbols J-I+1, J-I+2, . . . , J-1, J.

Suppose in the original encoding that the number of repair symbols N is equal to E, and exactly one source symbol maps to each repair symbol. Then, the intermediate value for repair symbol J may be the XOR of exactly I source symbol neighbors, and the new intermediate value for repair symbol J may be the XOR of the number of these I source symbol neighbors that were not received (e.g., missing). The L received repair symbols may have a new degree that is defined based on their new intermediate value as follows (which takes into account the "staircase" construction). The number of such missing source symbol neighbors may be defined to be the new degree of repair symbol J relative to the set of received source and repair symbols.

In the decoding with respect to this new degree, the expected average new degree of received repair symbols may be E/L*M/K~E/K with essentially a Poisson distribution on the number of edges for each received repair symbol. The missing M source symbols may then have degrees distributed according to the LT-type distribution degree described above.

In view of exemplary systems shown and described herein, methodologies that may be implemented in accordance with the disclosed subject matter will be better appreciated with reference to various functional block diagrams. While, for purposes of simplicity of explanation, methodologies are shown and described as a series of acts/blocks, it is to be understood and appreciated that the claimed subject matter is not limited by the number or order of blocks, as some blocks may occur in different orders and/or at substantially the same time with other blocks from what is depicted and described herein. Moreover, not all illustrated blocks may be required to implement methodologies described herein. It is to be appreciated that functionality associated with blocks may be implemented by various aspects of the systems disclosed herein.

Figure 7:
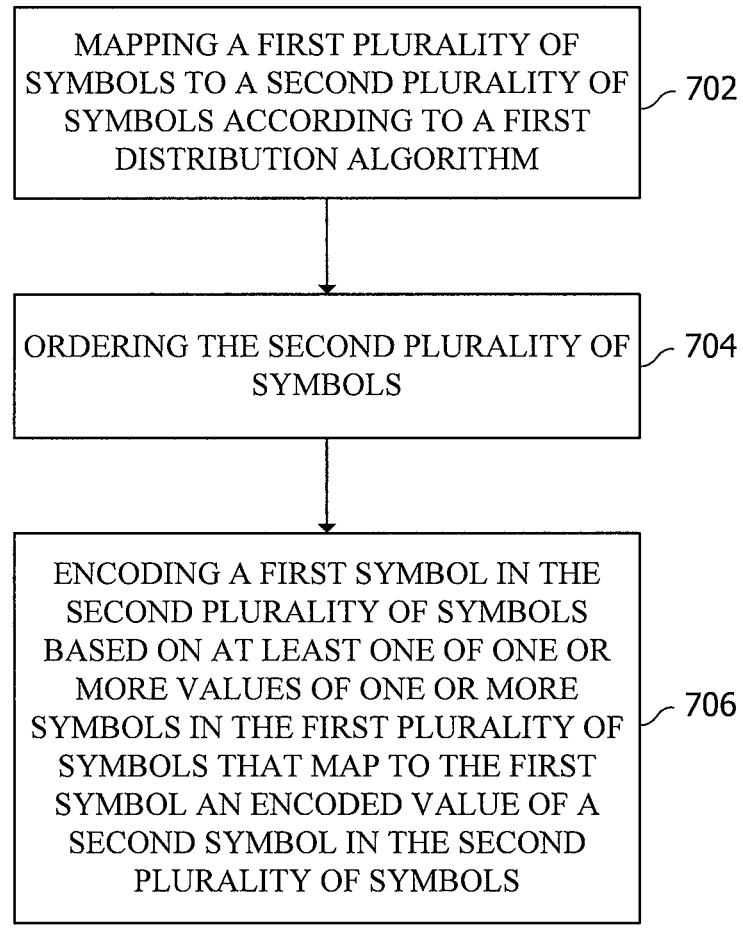
FIG. 7 shows a flow diagram illustrating a method for encoding data for transmission over a communications channel according to one embodiment of the disclosure.

FIG. 7 shows a flow diagram illustrating a method for encoding data for transmission over a communications channel according to one embodiment of the disclosure. It is noted that embodiments of method 700 may be implemented in accordance with the systems and embodiments described above with respect to FIGS. 1-6. For example, embodiments of method 700 may be implemented by system 100. In general, embodiments of method 700 may be implemented by other similar systems without deviating from this disclosure so long as the systems, whether directly or indirectly, support the operations as described herein.

Specifically, method 700 of the illustrated embodiments includes, at block 702, mapping a first plurality of symbols to a second plurality of symbols according to a first distribution algorithm. At block 704, method 700 includes ordering the second plurality of symbols. Method 700 also includes, at block 706, encoding a first symbol in the second plurality of symbols based on at least one of one or more values of one or more symbols in the first plurality of symbols that map to the first symbol and an encoded value of a second symbol in the second plurality of symbols.

Figure 8:
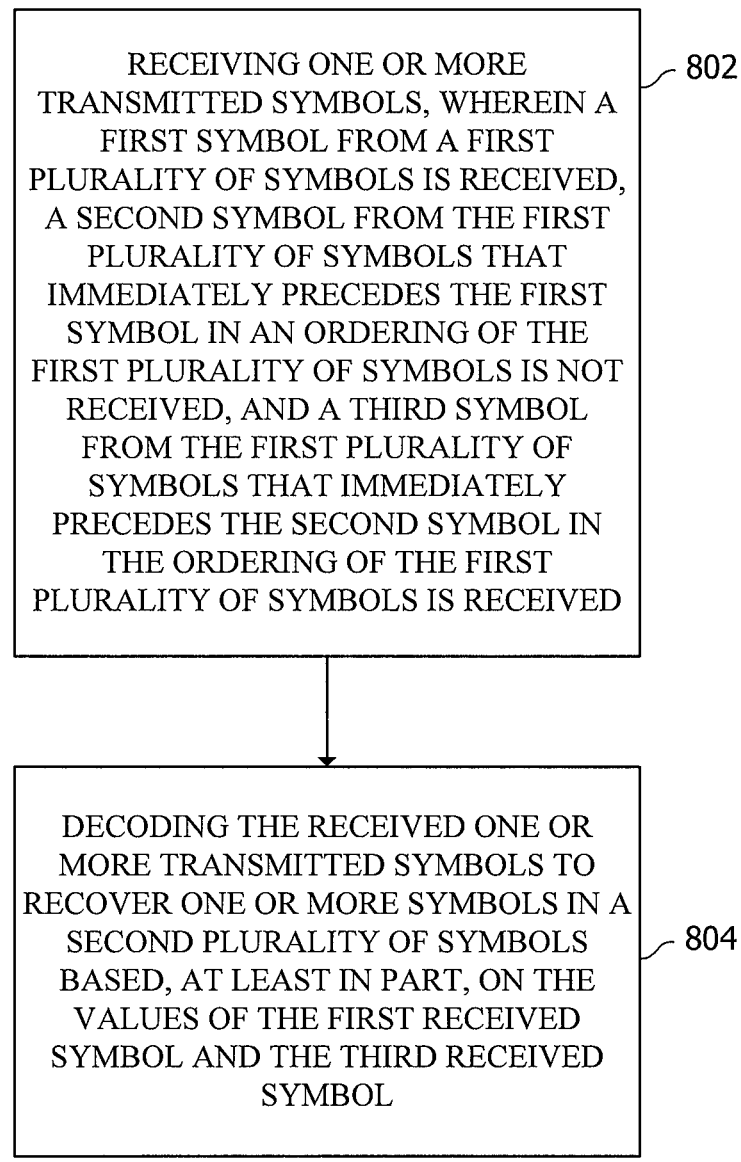
FIG. 8 shows a flow diagram illustrating a method for decoding data transmitted over a communications channel according to one embodiment of the disclosure.

FIG. 8 shows a flow diagram illustrating a method for decoding data transmitted over a communications channel according to one embodiment of the disclosure. It is noted that embodiments of method 800 may be implemented in accordance with the systems and embodiments described above with respect to FIGS. 1-6. For example, embodiments of method 800 may be implemented by system 100. In general, embodiments of method 800 may be implemented by other similar systems without deviating from this disclosure so long as the systems, whether directly or indirectly, support the operations as described herein.

Specifically, method 800 of the illustrated embodiments includes, at block 802, receiving one or more transmitted symbols, wherein a first symbol from a first plurality of symbols is received, a second symbol from the first plurality of symbols that immediately precedes the first symbol in an ordering of the first plurality of symbols is not received, and a third symbol from the first plurality of symbols that immediately precedes the second symbol in the ordering of the first plurality of symbols is received. At block 804, method 800 includes decoding the received one or more transmitted symbols to recover one or more symbols in a second plurality of symbols based, at least in part, on the values of the first received symbol and the third received symbol. In some embodiments, the second plurality of symbols may be mapped to the first plurality of symbols according to a first distribution algorithm.

The schematic flow chart diagrams of FIGS. 7 and 8 are generally set forth as logical flow chart diagrams. As such, the depicted order and labeled steps are indicative of one embodiment of the disclosed methods. Other steps and methods may be conceived that are equivalent in function, logic, or effect to one or more steps, or portions thereof, of the illustrated methods. Additionally, the format and symbols employed are provided to explain the logical steps of the methods and are understood not to limit the scope of the methods. Although various arrow types and line types may be employed in the flow chart diagrams, they are understood not to limit the scope of the corresponding methods. Indeed, some arrows or other connectors may be used to indicate only the logical flow of the methods. For instance, an arrow may indicate a waiting or monitoring period of unspecified duration between enumerated steps of the depicted methods. Additionally, the order in which a particular method occurs may or may not strictly adhere to the order of the corresponding steps shown.

Pseudocode that may be implemented by hardware and/or software in accordance with embodiments of the disclosure is provided below:

```
Encoding: /* at a sender */
    Input parameters: K, D
    K = number of source symbols, D is the maximum degree
    Input Data: K source symbols, S_1, S_2, ... , S_K
    /* Source symbols are all equal size, T bytes each, generated repair symbols are
    also T bytes each, where T can be any value, but generally is chosen so that T
```

```
bytes fit into a packet for a packet based transmission. */
Output data: E repair symbols, R_1, R_2, ..., R_E
Encoding Algorithm:
    E = 0
    For I = 1, ... ,K
        For source symbol S_I
            Choose X uniformly at random from interval [0,1)
            Set degree of S_I to d_I = minimum{ D, ceiling{1/X} }
            E = E + d_I
    Choose a random permutation pi of 1, ... , E
    J = 0
        For I = 1, ... ,K
            For M = 1, ... , d_I
                J = J+1
                Map the M^th edge out of S_I to repair symbol R_pi(J)
                Set R_pi(J) = S_I
    For J = 2, ... ,E
        R_J = R_J XOR R_{J-1}              /* do staircase */
Sending Process/Algorithm:
    Choose a random permutation rho of 1, ... , E
    Send mix of source symbols and repair symbols
        Source symbols can be sent in order S_1, S_2, ... , S_K
        Repair symbols can be sent in order R_rho(1), R_rho(2), ... , R_rho(E)
    (The mix of sending source and repair can be anything, e.g., send 3 source
symbols, send 5 repair symbols, send 10 source symbols, etc.)
        The index (identifier) of each sent source or repair symbol is included
(either implicitly or explicitly) in the packet that contains that symbol (assuming a
packet based transmission)
Network: Potentially some of the sent packets are not received at a receiver
Decoding: /* at a receiver */
    Input: K-M received source symbols and L received repair symbols, together with indices
(identifiers) of received source and repair symbols.
    Input parameters and other common information: K, E, permutation pi
    Output: Values of the M missing source symbols
    Let J(1), ... , J(L) be the indices of the received repair symbols, in order of
increasing index value, i.e., J(1) < J(2), ... , J(L)
    For I = L, ... , 2
        R_J(I) = R_J(I) XOR R_J(I-1)       /* undo staircase */
    For each received source symbol S
        For each edge d out of S
            Let I be the repair symbol index to which edge d out of S connects
                /* use pi to determine I */
            Let J be the smallest index >= I such that R_J has been received
            R_J = R_J XOR S    /* this removes the dependency of the repair symbols on
edge d of S */
```

Now, the L received repair symbols only depend on the M missing source symbols

Solve the system of L received values of repair symbols to solve for the M missing values of source symbols using a mixture of Belief Propagation and Inactivation Decoding.

Some embodiments of the above described may be conveniently implemented using a conventional general purpose or a specialized digital computer or microprocessor programmed according to the teachings herein, as will be apparent to those skilled in the computer art. Appropriate software coding may be prepared by programmers based on the teachings herein, as will be apparent to those skilled in the software art. Some embodiments may also be implemented by the preparation of application-specific integrated circuits or by interconnecting an appropriate network of conventional component circuits, as will be readily apparent to those skilled in the art. Those of skill in the art would understand that information and signals may be represented using any of a variety of different technologies and techniques. For example, data, instructions, requests, information, signals, bits, symbols, and chips that may be referenced throughout the above description may be represented by voltages, currents, electromagnetic waves, magnetic fields or particles, optical fields or particles, or any combination thereof.

Some embodiments include a computer program product comprising a computer-readable medium (media) having instructions stored thereon/in and, when executed (e.g., by a processor), perform methods, techniques, or embodiments described herein, the computer readable medium comprising sets of instructions for performing various steps of the methods, techniques, or embodiments described herein. The computer readable medium may comprise a storage medium having instructions stored thereon/in which may be used to control, or cause, a computer to perform any of the processes of an embodiment. The storage medium may include, without limitation, any type of disk including floppy disks, mini disks (MDs), optical disks, DVDs, CD-ROMs, micro-drives, and magneto-optical disks, ROMs, RAMs, EPROMs, EEPROMs, DRAMs, VRAMs, flash memory devices (including flash cards), magnetic or optical cards, nanosystems (including molecular memory ICs), RAID devices, remote data storage/archive/warehousing, or any other type of media or device suitable for storing instructions and/or data thereon/in. Additionally, the storage medium may be a hybrid system that stored data across different types of media, such as flash media and disc media. Optionally, the different media may be organized into a hybrid storage aggregate. In some embodiments different media types may be prioritized over other media types, such as the flash media may be prioritized to store data or supply data ahead of hard disk storage media or different workloads may be supported by different media types, optionally based on characteristics of the respective workloads. Additionally, the system may be organized into modules and supported on blades configured to carry out the storage operations described herein.

Stored on any one of the computer readable medium (media), some embodiments include software instructions for controlling both the hardware of the general purpose or specialized computer or microprocessor, and for enabling the computer or microprocessor to interact with a human user and/or other mechanism using the results of an embodiment. Such software may include without limitation device drivers, operating systems, and user applications. Ultimately, such computer readable media further includes software instructions for performing embodiments described herein. Included in the programming (software) of the general-purpose/specialized computer or microprocessor are software modules for implementing some embodiments.

Those of skill would further appreciate that the various illustrative logical blocks, modules, circuits, and algorithm steps described in connection with the disclosure herein may be implemented as electronic hardware, computer software stored on a computing device and executed by one or more processing devices, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the embodiments disclosed herein may be implemented or performed with a general-purpose processor, a digital signal processor (DSP), an application-specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The techniques or steps of a method described in connection with the embodiments disclosed herein may be embodied directly in hardware, in software executed by a processor, or in a combination of the two. In some embodiments, any software module, software layer, or thread described herein may comprise an engine comprising firmware or software and hardware configured to perform embodiments described herein. In general, functions of a software module or software layer described herein may be embodied directly in hardware, or embodied as software executed by a processor, or embodied as a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium may be coupled to the processor such that the processor can read data from, and write data to, the storage medium. In the alternative, the storage medium may be integral to the processor. The processor and the storage medium may reside in an ASIC. The ASIC may reside in a user device. In the alternative, the processor and the storage medium may reside as discrete components in a user device.

While the embodiments described herein have been described with reference to numerous specific details, one of ordinary skill in the art will recognize that the embodiments can be embodied in other specific forms without departing from the spirit of the embodiments. Thus, one of ordinary skill in the art would understand that the embodiments described herein are not to be limited by the foregoing illustrative details, but rather are to be defined by the appended claims.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present disclosure, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of encoding data for transmission over a communications channel, comprising:
    mapping a first plurality of symbols to a second plurality of symbols according to a first distribution algorithm, wherein a number of edges of the mapping associated with a symbol in the first plurality of symbols is determined randomly according to the first distribution algorithm;
    ordering the second plurality of symbols; and
    encoding a first symbol in the second plurality of symbols based on at least one of:
        one or more values of one or more symbols in the first plurality of symbols that map to the first symbol; and
        an encoded value of a second symbol in the second plurality of symbols, wherein the second symbol immediately precedes the first symbol in the ordering of the second plurality of symbols.

2. The method of claim 1, wherein mapping the first plurality of symbols to the second plurality of symbols according to the first distribution algorithm comprises:
    mapping each symbol in a first portion of the first plurality of symbols to a first number of symbols in the second plurality of symbols; and
    mapping each symbol in a second portion of the first plurality of symbols to a second number of symbols in the second plurality of symbols.

3. The method of claim 1, wherein the encoded value of the second symbol is based on at least one of:
    one or more values of one or more symbols in the first plurality of symbols that map to the second symbol; and
    an encoded value of a third symbol in the second plurality of symbols, wherein the third symbol immediately precedes the second symbol in the ordering of the second plurality of symbols.

4. The method of claim 1, further comprising determining an intermediate value for the first symbol, wherein the intermediate value is equal to one of:
- a value of a symbol in the first plurality of symbols that maps to the first symbol when only one symbol in the first plurality of symbols maps to the first symbol; and
- a value equal to an exclusive disjunction of the one or more values of the one or more symbols in the first plurality of symbols that map to the first symbol.

5. The method of claim 4, wherein encoding the first symbol comprises setting the value of the first symbol to the value of the exclusive disjunction of the determined intermediate value and the encoded value of the second symbol.

6. The method of claim 1, wherein mapping the first plurality of symbols to the second plurality of symbols according to the first distribution algorithm results in at least one of:
- approximately ½ of the symbols in the first plurality of symbols having two edges; and
- approximately ⅙ of the symbols in the first plurality of symbols having three edges.

7. The method of claim 1, wherein a number of edges of the mapping associated with a symbol in the second plurality of symbols is determined randomly according to a second distribution algorithm.

8. The method of claim 7, wherein using the first distribution algorithm and the second distribution algorithm to form the mapping from the first plurality of symbols to the second plurality of symbols comprises:
- determining a number E of edges;
- determining a number K of symbols in the first plurality of symbols;
- determining a number N of symbols in the second plurality of symbols;
- assigning each symbol of the first plurality of symbols a degree value, wherein the sum of the degree values over all symbols in the first plurality of symbols is equal to E, and wherein the degree value for each symbol in the first plurality of symbols is determined by the first distribution algorithm;
- assigning each symbol of the second plurality of symbols a degree value, wherein the sum of the degree values over all symbols in the second plurality of symbols is equal to E, and wherein the degree value for each symbol in the second plurality of symbols is determined by the second distribution algorithm;
- mapping each of the E edges randomly to a unique symbol of the first plurality of symbols, wherein the number of edges mapped to each symbol is equal to the degree value assigned to that symbol; and
- mapping each of the E edges randomly to a unique symbol of the second plurality of symbols, wherein the number of edges mapped to each symbol is equal to the degree value assigned to that symbol.

9. The method of claim 1, further comprising transmitting one or more symbols comprising one of:
- the first plurality of symbols;
- the second plurality of symbols; and
- a combination of symbols in the first plurality of symbols and symbols in the second plurality of symbols.

10. The method of claim 9, wherein the order in which one or more symbols are transmitted from at least the second plurality of symbols is random.

11. A method of decoding data transmitted over a communications channel, comprising:
- receiving one or more transmitted symbols, wherein a first symbol from a first plurality of symbols is received, a second symbol from the first plurality of symbols that immediately precedes the first symbol in an ordering of the first plurality of symbols is not received, and a third symbol from the first plurality of symbols that immediately precedes the second symbol in the ordering of the first plurality of symbols is received; and
- decoding the received one or more transmitted symbols to recover one or more symbols in a second plurality of symbols based, at least in part, on values of the first received symbol and the third received symbol, wherein the second plurality of symbols are mapped to the first plurality of symbols according to a first distribution algorithm.

12. The method of claim 11, wherein a number of edges of the mapping associated with a symbol in the second plurality of symbols is determined randomly according to the first distribution algorithm.

13. The method of claim 11, wherein at least one of the symbols from the second plurality of symbols that is mapped to the second symbol that is not received is recovered based, at least in part, on the values of the first received symbol and the third received symbol.

14. The method of claim 11, wherein decoding comprises determining an exclusive disjunction value of the values of the symbols from the second plurality of symbols that mapped to the first received symbol and the values of the symbols from the second plurality of symbols that mapped to the second symbol that is not received.

15. The method of claim 14, wherein determining the exclusive disjunction value comprises calculating the exclusive disjunction value of the value of the first received symbol and the value of the third received symbol.

16. A computer program product for decoding data transmitted over a communications channel, the computer program product comprising:
- a non-transitory computer-readable medium having program code recorded thereon, the program code including:
  - program code to receive one or more transmitted symbols, wherein a first symbol from a first plurality of symbols is received, a second symbol from the first plurality of symbols that immediately precedes the first symbol in an ordering of the first plurality of symbols is not received, and a third symbol from the first plurality of symbols that immediately precedes the second symbol in the ordering of the first plurality of symbols is received; and
  - program code to decode the received one or more transmitted symbols to recover one or more symbols in a second plurality of symbols based, at least in part, on values of the first received symbol and the third received symbol, wherein the second plurality of symbols are mapped to the first plurality of symbols according to a first distribution algorithm.

17. The computer program product of claim 16, wherein a number of edges of the mapping associated with a symbol in the second plurality of symbols is determined randomly according to the first distribution algorithm.

18. The computer program product of claim 16, wherein at least one of the symbols from the second plurality of symbols that is mapped to the second symbol that is not received is recovered based, at least in part, on the values of the first received symbol and the third received symbol.

19. The computer program product of claim 16, wherein the program code to decode comprises program code to determine an exclusive disjunction value of the values of the symbols from the second plurality of symbols that mapped to the first received symbol and the values of the symbols from the second plurality of symbols that mapped to the second symbol that is not received.

20. The computer program product of claim 19, wherein the program code to determine the exclusive disjunction value comprises program code to calculate the exclusive disjunction value of the value of the first received symbol and the value of the third received symbol.

* * * * *